United States Patent
Vorenkamp

(10) Patent No.: US 6,903,588 B2
(45) Date of Patent: Jun. 7, 2005

(54) SLEW RATE CONTROLLED OUTPUT BUFFER

(75) Inventor: Pieter Vorenkamp, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/413,519

(22) Filed: Apr. 15, 2003

(65) Prior Publication Data
US 2004/0207452 A1 Oct. 21, 2004

(51) Int. Cl.[7] .................................................. H03K 5/12
(52) U.S. Cl. ...................................... 327/170; 327/112
(58) Field of Search .............................. 327/112, 108, 327/170, 333, 379–381, 308, 389; 326/82, 83

(56) References Cited

U.S. PATENT DOCUMENTS

| | | | |
|---|---|---|---|
| 4,894,561 A | | 1/1990 | Nogami ...................... 326/27 |
| 5,949,259 A | * | 9/1999 | Garcia ........................ 327/111 |
| 5,973,512 A | * | 10/1999 | Baker ......................... 326/87 |
| 6,437,622 B1 | | 8/2002 | Tinsley et al. .............. 327/175 |
| 6,617,897 B2 | * | 9/2003 | Lee ............................ 327/170 |
| 2002/0163360 A1 | * | 11/2002 | Fifield et al. ................. 326/83 |

FOREIGN PATENT DOCUMENTS

| | | |
|---|---|---|
| EP | 0 479 700 A2 | 4/1992 |
| EP | 0 678 983 A1 | 10/1995 |

OTHER PUBLICATIONS

Annex to the European Search Report on European Patent Application No. EP 04009044.1–2215.

* cited by examiner

Primary Examiner—Quan Tra
(74) Attorney, Agent, or Firm—Sterne, Kessler, Goldstein & Fox P.L.L.C.

(57) ABSTRACT

An output buffer includes first and second circuit portions coupled between input and output terminals. Each circuit portion includes a capacitive element; an output transistor having a gate coupled to the capacitive element, and a drain that drives a voltage at the output terminal; and a current generator configured to generate a charging current that is directed to the capacitive element responsive to a logic transition at the input terminal, wherein the charging current causes a substantially linear ramp voltage to form at the gate of the output transistor, whereby the ramp voltage controls a slew rate of the output terminal voltage.

18 Claims, 4 Drawing Sheets

SLEW RATE CONTROLLED OUTPUT BUFFER

BACKGROUND

1. Field of Invention

The present invention relates generally to output buffer circuits.

2. Related Art

An output buffer that operates in a parallel interface, such as the Peripheral Component Interface (PCI)-X (where X indicates enhancement to PCI), is required to operate at ever increasing data rates. Typically, the output buffer is also required to drive large capacitive loads. To help meet such requirements, the output buffer needs to have an output slew rate and an output impedance that are both well controlled.

With the reduced power supply voltages used on deep sub-micron CMOS Integrated Circuit (IC) chips, in addition to the increased operating speeds mentioned above, the impact of noise generated by simultaneous switched outputs of a conventional output buffer can cause spurious components that interfere with other signals on a given IC chip or on an application circuit board/card using the conventional output buffer. Thus, there is a need for an output buffer that reduces or even eliminates such interference.

BRIEF SUMMARY OF THE INVENTION

In an embodiment, the present invention is directed to a slew rate controlled output buffer. The output buffer (or "buffer") reduces simultaneous switching outputs, and thus interference associated therewith. The output buffer has a tightly controlled output slew rate and a tightly controlled output impedance. The buffer also reduces propagation delay between its input and impedance. The buffer also reduces propagation delay between its input and output terminals. The buffer is simple in design, low cost, and operates off of only two different power supply voltages. The buffer has reduced dynamic power consumption compared to conventional circuits.

In an embodiment, the output buffer comprises first and second circuit portions coupled between input and output terminals. Each circuit portion includes: a capacitive element; an output transistor having a gate coupled to the capacitive element, and a drain that drives a voltage at the output terminal; and a current generator configured to generate a charging current that is directed to the capacitive element responsive to a logic transition at the input terminal. The charging current causes a substantially linear ramp voltage to form at the gate of the output transistor, whereby the ramp voltage controls a slew rate of the output terminal voltage.

Further embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention. In the drawings, like reference numbers indicate identical or functionally similar elements.

DETAILED DESCRIPTION OF THE INVENTION

Glossary

CMOS—Complementary Metal Oxide Semiconductor.

FET—Field Effect Transistor. The gate terminal, source terminal and drain terminal of a FET are referred to herein as the gate, source and drain of the FET, respectively.

Figure 1:
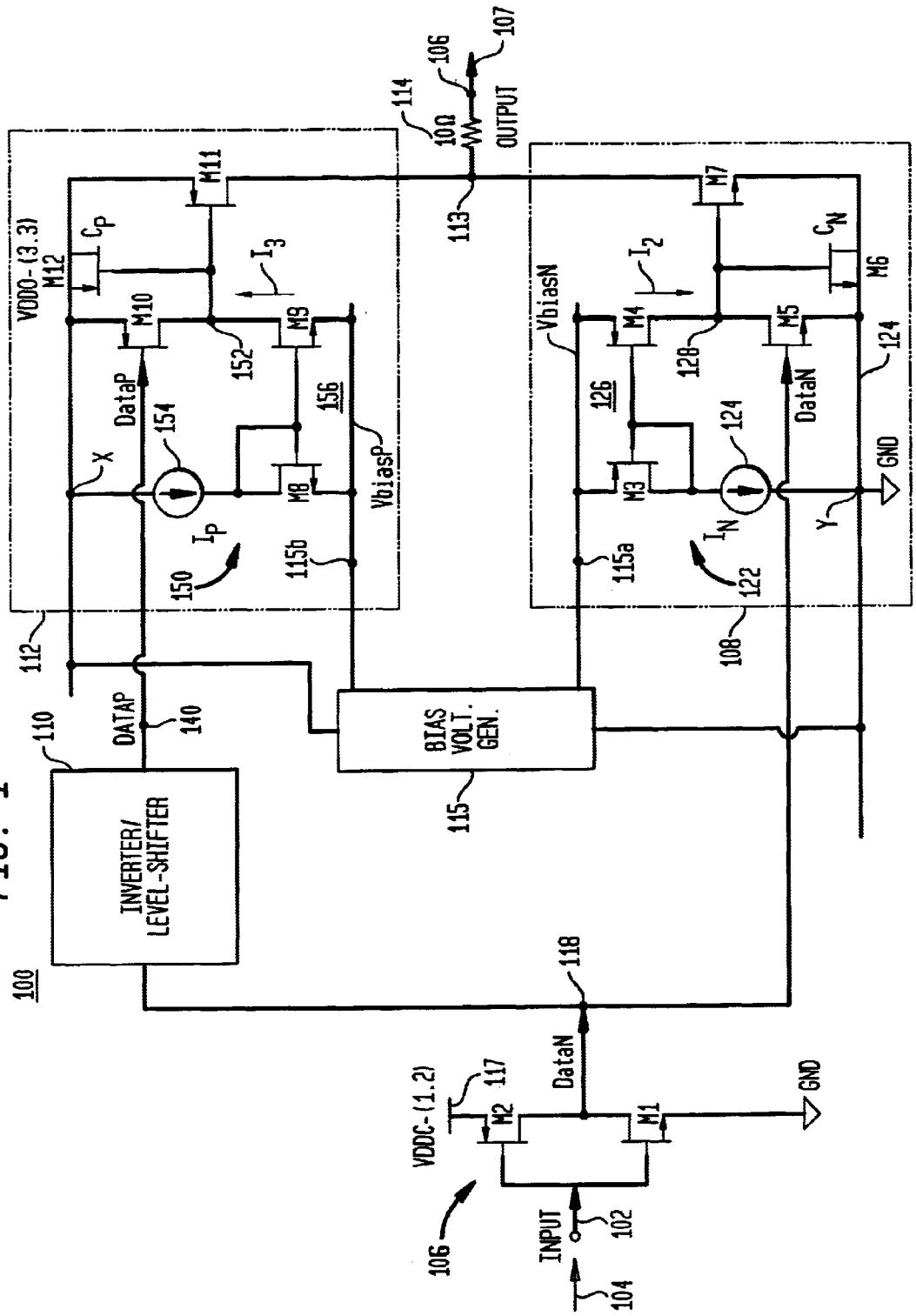
FIG. 1 is a circuit and block diagram of an example output buffer constructed and operated in accordance with the present invention.

NMOS—n-type MOS. In FIG. 1, an arrow pointing from the gate to the source of a FET indicates an NMOS FET, while an arrow pointing in the opposite direction indicates a PMOS FET, as is understood in the art.

PMOS—p-type MOS, which is complementary to NMOS.

Overview

FIG. 1 is a circuit and block diagram of an example output buffer 100 constructed and operated in accordance with the present invention. Buffer 100 may be constructed on a single IC. In an embodiment, output buffer 100 is a PCI-X Input/Output (I/O) output buffer. Buffer 100 includes an input terminal 102 for receiving an input logic signal or voltage 104, an output terminal 106, and circuitry, coupled between the input and output terminals, for producing an output logic signal or voltage 107 at the output terminal responsive to the input signal. In the embodiment depicted in FIG. 1, buffer 100 operates as an inverter, whereby when input signal 104 is a logic low or a logic high, output signal 107 is a logic high or a logic low, respectively. In an alternative arrangement, buffer 100 is a non-inverting output buffer.

Buffer 100 controls a voltage slew rate at which output signal 107 transitions or "slews" between logic high and logic low voltage levels, responsive to corresponding logic transitions of input signal 104. Also, the circuitry of buffer 100 controls or sets an output impedance of buffer 100, looking back into the output of buffer 100 through output terminal 106.

A first circuit portion of buffer 100 includes an inverter 106 and a first or lower output stage 108 connected in series with each other and between input and output terminals 102 and 106. A second circuit portion of output buffer 100 includes inverter 106, inverter/level-shifter 110, and a second or upper output stage 112, connected in series with each other and between input and output terminals 102 and 106.

Upper and lower output stages 108, 112 have respective outputs coupled to a node 113. Buffer 100 includes an output resistor 114 coupled between node 113 and output terminal 106. Thus, output stages 108, 112 both can drive the voltage at output terminal 106 through node 113 and resistor 114.

Buffer. 100 also includes a bias voltage generator 115 coupled between (i) a first power supply rail or node X operating at power supply voltage VDDO (also referred to as an output power supply rail voltage), such as 3.3 Volts, and (ii) a second power supply rail or node Y operating at a second potential, such as a ground potential (i.e., 0 Volts). Bias voltage generator 115 generates a first bias voltage VbiasN at a bias voltage node 115a of the generator and a second bias voltage VbiasP at a bias voltage node 115b of the generator. VbiasN and VbiasP are between VDDO and ground, for example, near 1.5 Volts. In an embodiment discussed below in connection with FIG. 6, the voltages VbiasN and VbiasP are the same. In another embodiment discussed below in connection with FIG. 7, the voltages VbiasN and VbiasP are different.

First Circuit Portion

Still with reference to FIG. 1, output buffer 100 is now described in detail. Inverter 106, coupled between input terminal 102 and a node 118, includes transistors M1 and M2 connected between a third power supply rail 117 that operates at a voltage VDDC, such as 1.2 V. Transistors M1 and M2 are interconnected so as to invert the logic level of input signal 104, at output node 118. Inverter 106 produces a signal or voltage DataN at node 118, and provides DataN to an input of lower output stage 108, described below. In accordance with the present invention, lower output stage 108 controls a voltage slew rate of output signal 107 when the output stage drives the output signal from a logic high to a logic low, in response to a low-to-high logic transition of input signal 104. Also, output stage 108 sets the output impedance of buffer 100 while the output signal is maintained at a logic low.

Output stage 108 includes a current generator 122 coupled to voltage node 115a, whereby the current generator operates off of voltage VbiasN. Current generator 122 includes a constant current source 124 and a diode configured transistor M3, connected in series with each other and between voltage node 115a and ground node Y. Constant current source 124 produces a constant current $I_N$, which flows through diode configured transistor M3. Current generator 122 also includes a mirror transistor M4 having (i) its source-drain path coupled between voltage node 115a and an output or charge node 128 of current generator 122, and (ii) its gate coupled to the gate of transistor M3. Together, transistors M3 and M4 form a current mirror 126 which mirrors constant current $I_N$ into a mirror current $I_2$ that flows into charge node 128.

Output stage 108 further includes a transistor M5 having (i) its gate coupled to node 118, so as to be driven by signal DataN, and (ii) its source-drain path connected between charge node 128 and ground node Y. Transistor M5 is configured to operate as a switch that either opens or closes responsive to either a logic low or a logic high level of signal DataN.

Output stage 108 also includes a capacitive element or capacitor $C_N$ coupled between charge node 128 and ground node 124, so as to be connected in parallel with the source-drain path of switch M5. In an embodiment, capacitor $C_N$ is a transistor M6 configured as a capacitor, having its gate coupled to charge node 128 and both its source and drain connected to ground node Y.

Output stage 108 further includes an output transistor M7 having (i) its gate connected to charge node 128 and capacitor $C_N$, (ii) its drain connected to node 113, and (iii) its source connected to ground node 124. Current generator 122, switch transistor M5 and capacitor $C_N$ cooperate to control the voltage at charge node 128, and thus at the gate of transistor M7, so as to control the manner in which the drain of transistor M7 drives the voltage at output terminal 106, as will be described more fully below.

The operation of lower output stage 108 is now described in detail in connection with low-to-high and high-to-low logic transitions of input signal 104. Assume initially a steady state condition where input signal 104 is a logic low. In this condition, upper output stage 112 is activated, and thus drives output signal 107 to a logic high. Lower output stage 108 is inactive, and thus, output transistor M7 is OFF. Also, signal DataN is a logic high, and in response, switch M5 is turned ON. Thus, current $I_2$ flows into charge node 128, and through the source-drain path of transistor M5, to ground node Y. Also, transistor M5 has discharged to ground any charge that may have been accumulated on capacitor $C_N$. Thus, the voltage at charge node 128 will be at or near 0 V. Therefore, transistor M7 is turned OFF.

Next, assume input signal 104 undergoes a low-to-high logic transition. When this occurs, upper output stage 112 becomes deactivated, and thus stops driving the voltage at output terminal 106. Also, signal DataN transitions to a logic low. In response to signal DataN being a logic low, transistor M5 turns OFF. Then, current $I_2$ flows into charge node 128, and begins to charge capacitor $C_N$ and a gate capacitance of transistor M7. Thus, the voltage at node 128 begins to increase upwardly from 0 V. The voltage at node 128 increases at a first rate until it is equal to a gate-to-source threshold voltage $V_{TH}$ of transistor M7.

When the voltage at node 128 is equal to $V_{TH}$, transistor M7 begins to turn ON. After transistor M7 turns ON, the voltage at node 128 continues to increase substantially linearly over time as the charge continues to builds on capacitor $C_N$ responsive to current 12, but at a second rate that is less than the first rate. The voltage at node 128 continues to rise at the second rate until the voltage is at or near voltage VbiasN. When the voltage at node 128 is at or near voltage VbiasN, mirror transistor M4 becomes saturated and thus conducts little or no current. Thus, the voltage at node 128 levels-off at or near the voltage VbiasN.

In response to the substantially linear increase in voltage over time at node 128 from $V_{TH}$ to VbiasN, transistor M7 slowly transitions from being just barely turned ON to being fully ON, respectively. This causes the voltage at output terminal 106 to transition from a logic high to a logic low at a slew rate controlled in accordance with the substantially linear voltage at node 128.

A typical slew rate of the voltage at node 128, and thus, of the output voltage, is on the order of 1 Volt/nanosec. The slew rate may be controlled in accordance with the ratio of the magnitude of current $I_N$ to the capacitance of capacitor $C_N$. Typical values for the magnitude of current $I_N$ and the capacitance of capacitor $C_N$ are approximately 1 milliAmpere and 1 picoFarad, respectively.

While input signal 104 remains high, transistor M7 continues to drive output signal 107 low. In response to a high-to-low logic transition of input signal 104, DataN becomes a logic high again. In response, switch transistor M5 turns ON again and capacitor M6 discharges through the switch transistor. This causes the voltage at node 128 to drop to 0 V, which turns OFF transistor M7. When this occurs, transistor M7 no longer drives the voltage at output terminal 106, and lower output stage 108 is considered deactivated again. Instead, upper output stage 112 takes over, that is, becomes activated again.

Lower output stage 108 controls or sets the output impedance of buffer 100 to a desired value during the high-to-low logic transition of output signal 107, and while the output signal is maintained low. Under these conditions, output stage 108 sets the output impedance in accordance with (i) a size of drive transistor M7, and (ii) the voltage of VbiasN. This is because the output impedance is a function of the gate and drain voltages of transistor M7 and the size of the transistor. In other words, the size of drive transistor M7 and the voltage VbiasN are main components that control the output impedance. A typical size in terms of gate width/length (W/L) for transistor M7 is on the order of 500 microns/0.3 microns. A typical output impedance for buffer 100 is approximately 100 ohms to 150 ohms.

In an alternative embodiment, capacitive element M6 and current generator 122 may be replaced with other circuits configured to cause the linear ramp voltage to form at the gate of transistor M7, as would be apparent to one having ordinary skill in the relevant art(s) given the present description. Such alternative circuits may include inductors and resistors, for example.

Second Circuit Portion

The second circuit portion includes inverter/level-shifter 110 coupled between node 118 and a node 140, which is coupled to an input of upper output stage 112. Circuit 110 inverts and level shifts signal DataN upward in voltage toward supply voltage VDDO, to produce signal DataP at a voltage level compatible with the logic used in upper output stage 112.

Upper output stage 112 is constructed and operated in manner that is substantially the same as lower output stage 108, with one main exception. Upper output stage 112 is constructed using logic, e.g., transistors, that is complementary to the logic of lower output stage 108. That is, each transistor in upper output stage 112 is complementary to its corresponding transistor in lower output stage 108. As a result, the signals processed in upper output stage 112 are essentially inverted compared to corresponding signals in lower output stage 108.

Output stage 112 includes a current generator 150 for generating a mirror current $I_3$ that flows into an output or charge node 152 of the current generator. Current generator 150 includes a constant current source 154 coupled with a current mirror 156 having mirror transistors M8 and M9. Constant current source 154 produces a constant current $I_P$, and current mirror 156 mirrors constant current $I_P$ into current $I_3$. Output stage 112 also includes a switch transistor M10 coupled to charge node 152, and a capacitive element $C_P$ (transistor M12) coupled in parallel with switch transistor M10 and to node 152. Output stage 112 also includes an output transistor M11 having its (i) gate coupled to capacitor $C_P$, (ii) drain coupled to node 113, and (iii) source coupled to first power supply rail X.

The operation of upper output stage 112 is now described in detail in connection with logic transitions of input signal 104. Assume initially a steady state condition where input signal 104 is a logic high. In this condition, lower output stage 108 is activated, and thus drives output signal 107 to a logic low, as described above. Upper output stage 108 is inactive, and thus, output transistor M11 is OFF. Also, inverter/level-shifter 110 causes signal DataP to be at a voltage that turns ON switch M10. Thus, transistor M10 essentially connects node 152 to voltage rail X, whereby the voltage at node 152 is at or near the voltage VDDO. In response to the high voltage at node 152, transistor M11 is turned OFF.

Next, assume a high-to-low logic transition of input signal 104. When this occurs, lower output stage 108 becomes deactivated, and thus stops driving to a low level the voltage at output terminal 106, as described above. Inverter/level-shifter 110 causes signal DataP to be at a voltage that turns OFF switch M10. Then, current $I_3$ begins to charge node 152 low, that is, downward from VDDO. Current 13 can be considered a negative current flowing into node 152. Thus, the voltage at node 128 begins to decrease from the voltage VDDO. The voltage at node 152 decreases at a first rate until it is equal to a gate-to-source threshold voltage $V_{TH}$ below VDDO.

At this point, transistor M11 begins to turn ON. After transistor M11 turns ON, the voltage at node 152 continues to decrease substantially linearly over time, as the current $I_3$ continues to charge node 152 low, but at a second rate that is less than the first rate. The voltage at node 152 continues to fall at the second rate until the voltage is at or near voltage VbiasP. When the voltage at node 152 is at or near voltage VbiasP, mirror transistor M9 becomes saturated and thus conducts little or no current. Thus, the voltage at node 152 levels-off at or near the voltage VbiasP.

In response to the substantially linear decrease in voltage over time at node 152 from VDDO-$V_{TH}$ down to VbiasN, transistor M11 slowly transitions from being just barely turned ON to being fully ON, respectively. This causes the voltage at output terminal 106 to transition from a logic low to a logic high at a slew rate controlled in accordance with the substantially linear voltage at node 152.

While input signal 104 remains low, transistor M11 continues to drive output signal 107 high. In response to a low-to-high transition of input signal 104, DataP causes switch transistor M5 to turn ON again, which causes the voltage at node 152 to rise to the voltage VDDO. This turns OFF transistor M11 again. When this occurs, transistor M11 no longer drives the voltage at output terminal 106, and upper output stage 108 is considered deactivated again. Lower output stage 112 takes over, that is, becomes activated again, as described above.

Upper output stage 112 controls or sets the output impedance of buffer 100 to a desired value during the low-to-high logic transition of output signal 107, and while the output signal is maintained high. Under these conditions, output stage 112 sets the output impedance in accordance with (i) a size of drive transistor M11, and (ii) the voltage of VbiasP. In other words, the size of drive transistor M11 and the voltage VbiasP are the main components that control the output impedance under these conditions. A typical size of drive transistor M11 is similar to or the same as that of transistor M7.

In another embodiment of buffer 100 discussed below in connection with FIG. 7, current generator 150 operates off of a bias voltage, VbiasP, that is different from VbiasN. In this embodiment, the voltage VbiasP controls the output impedance of buffer 100 during the active states of upper output stage 112.

From the description above, an output buffer (e.g., buffer 100) is responsive to an input signal (e.g., signal 104). The output buffer includes a first circuit part having an output transistor (e.g., M7), a bias generator (e.g., circuit 115) for generating a bias voltage (e.g., VbiasN), and a drive circuit coupled to the gate of the output transistor and the bias generator. The drive circuit includes a current generator (e.g., generator 122), a switch transistor (e.g., M5), and a capacitive element (e.g., M6). The drive circuit is configured to:

(i) control a slew rate of the output transistor responsive to a logic transition (e.g., high-to-low, or opposite, that is, low-to-high) of the input signal; and (ii) cause the bias voltage and a size of the output transistor to set an output impedance of the output buffer.

The output buffer also includes a second circuit part that is configured similarly to the first circuit portion (with the exception of the bias generator, which is common to both the first and second circuit part), and that operates responsive to a logic transition opposite in sense to that which activates the first circuit part.

Figure 2:
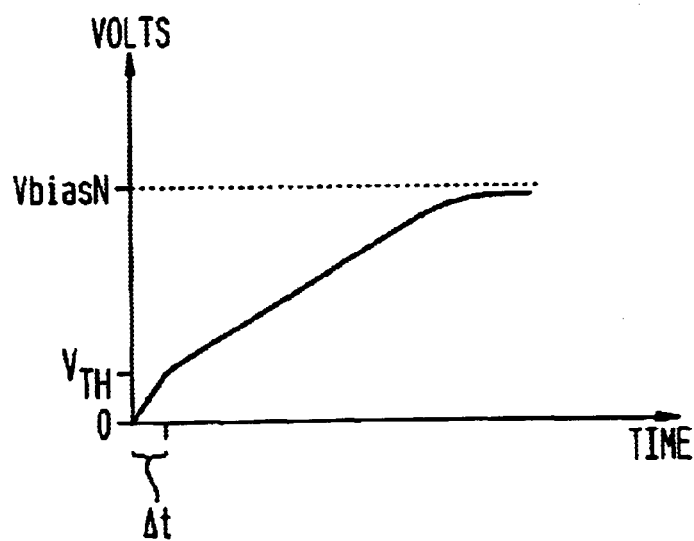
FIG. 2 is a voltage vs. time plot of the voltage at a charge node of the output buffer of FIG. 1, responsive to a low-to-high logic transition of an input signal applied to the output buffer.

FIG. 2 is a voltage vs. time plot of the voltage at node 128 responsive to a low-to-high logic transition of input signal 104. As depicted, initially, the node voltage increases quickly at a first rate from 0 Volts to a transistor threshold voltage $V_{TH}$ over a time period $\Delta t$. Then, the node voltage increases substantially linearly at a second rate from $V_{TH}$ to nearly VDDO. The quick initial increase in node voltage is at least partially due to the use of a transistor M6 configured as capacitive element $C_N$, and advantageously decreases propagation delay through buffer 100. If a conventional metal capacitor were used for capacitive element $C_N$ instead of the transistor M6, for example, then it would take longer for the node voltage to build to $V_{TH}$. This would disadvantageously increase the propagation delay through buffer 100.

Figure 3:
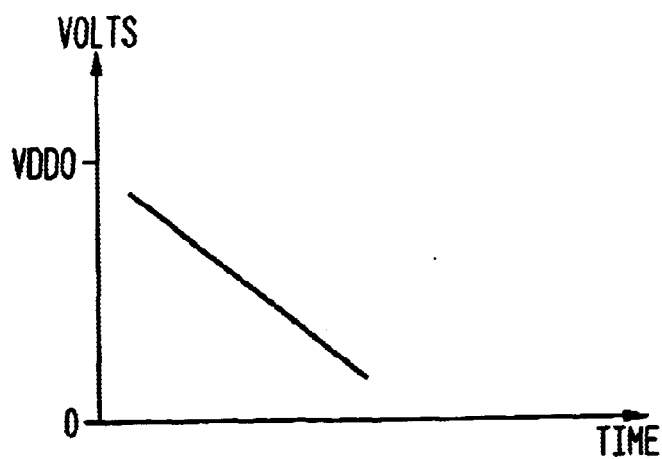
FIG. 3 is a voltage vs. time plot of the voltage at an output terminal of the output buffer of FIG. 1, responsive to the voltage at the charge node, as depicted in FIG. 2.

FIG. 3 is a voltage vs. time plot of the voltage at output terminal 106 (that is, of output signal 107) responsive to the voltage at node 128 depicted in FIG. 2. The rate at which output transistor M7 turns ON, and thus, the slew rate of the output voltage at output terminal 106, is controlled in accordance with the voltage at node 128.

Figure 4:
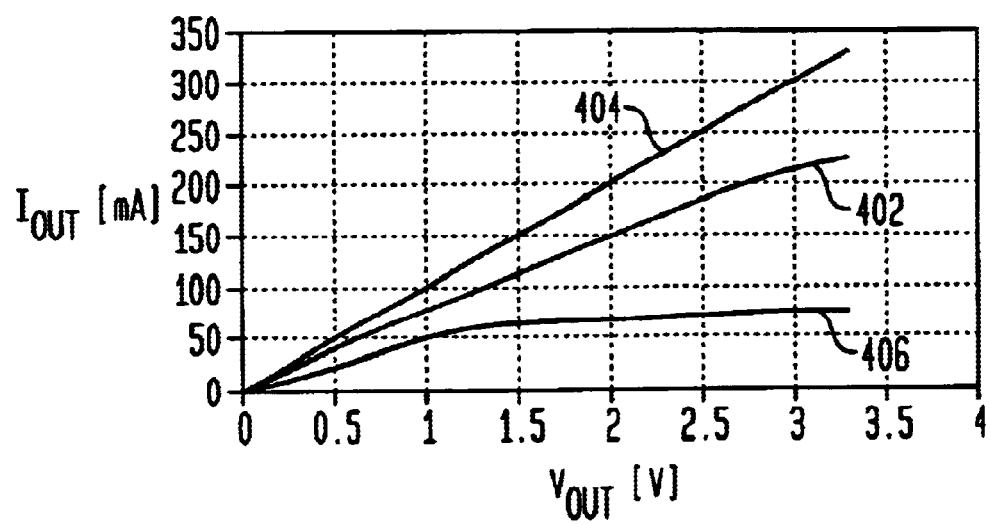
FIG. 4 is an example pull-down Voltage (V)-Current (I) plot of the output impedance of the output buffer of FIG. 1.

FIG. 4 is an example pull-down Voltage (V)-Current (I) plot of the output impedance of output buffer 100. This plot corresponds to when lower output stage 108 is driving low the voltage at output terminal 106. Curve 402 represents the output impedance, while curves 404 and 406 represent PCI-X I/O requirement limits.

Figure 5:
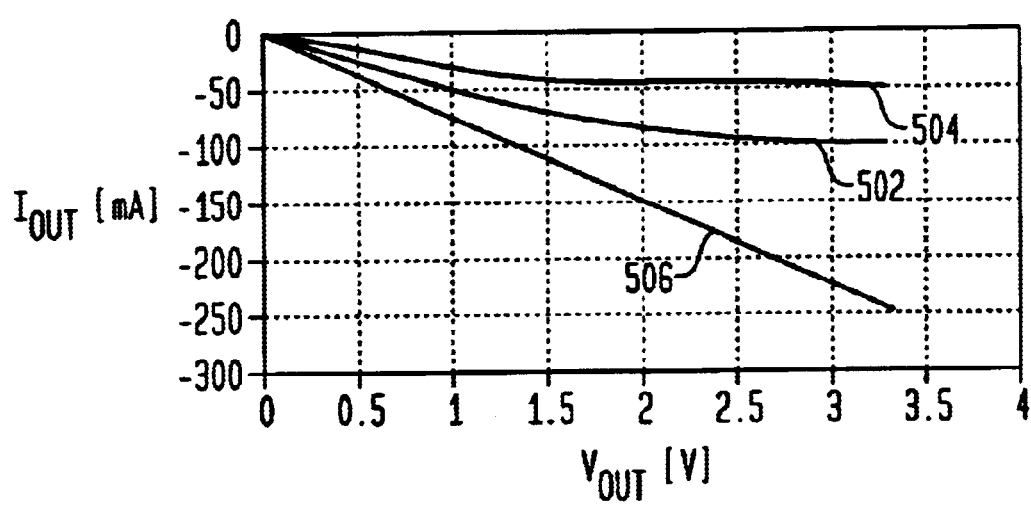
FIG. 5 is an example pull-up Voltage (V)-Current (I) plot of the output impedance of output buffer of FIG. 1.

FIG. 5 is an example pull-up Voltage (V)-Current (I) plot of the output impedance of output buffer 100. This plot corresponds to when upper output stage 112 is driving high the voltage at output terminal 106. Curve 502 represents the output impedance, while curves 504 and 506 represent PCI-X I/O requirement limits.

Figure 6:
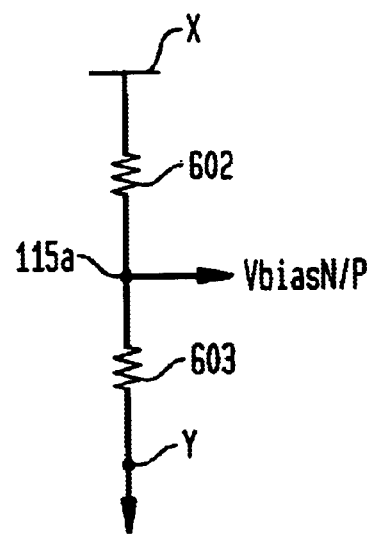
FIG. 6 is a circuit diagram of an example arrangement of a voltage bias generator used in the output buffer of FIG. 1.

FIG. 6 is a circuit diagram of an example arrangement of voltage bias generator 115. In this arrangement, bias generator 115 is a potential divider or resistor ladder including resistors 602 and 603 connected in series with each other and between power supply rails X and Y. Nodes 115a and 115b are both tapped-off of a connection point between the two resistors, whereby voltages VbiasN and VbiasP are the same.

Figure 7:
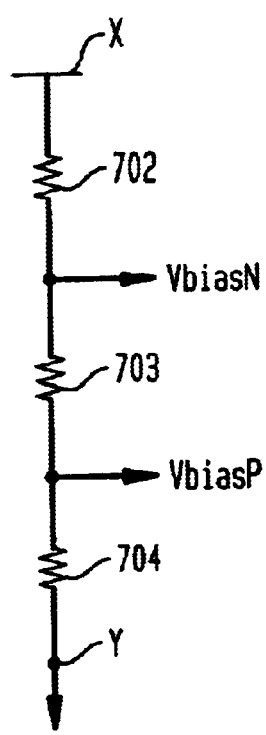
FIG. 7 is a circuit diagram of another example arrangement of a voltage bias generator.

FIG. 7 is a circuit diagram of another example arrangement of voltage bias generator 115. The bias generator of FIG. 7 corresponds to an embodiment of buffer 100 wherein current generators 122 and 150 operate off of different bias voltages. In the arrangement of FIG. 7, the bias generator is a potential divider including resistors 702, 703 and 704, connected in series with each other and between power supply rails X and Y. The bias generator of FIG. 7 generates first voltage VbiasN, off of which current generator 122 operates. In addition, the bias generator generates second voltage VbiasP, off of which current generator 150 operates. In this embodiment, VbiasN is greater than VbiasP. Other embodiments of bias generator 115 are envisioned.

In the embodiment depicted in FIG. 1, transistors M1, M5–M7 and M8–M9 are each NMOS FETs, and transistors M2–M4 and M10–M12 are each PMOS FETs.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of circuit diagrams and building blocks illustrating the performance of specified functions and relationships thereof. The boundaries of these functional building blocks and circuits have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components including digital and/or analog circuits or application specific integrated circuits, for example, or any combination thereof. Thus, the breadth and scope of the present invention should not be limited by any of the above-described exemplary embodiments, but should be defined only in accordance with the following claims and their equivalents.

What is claimed is:

1. An output buffer, comprising:
a first circuit portion and a second circuit portion each coupled between an input terminal and an output terminal of the output buffer, each circuit portion including:
a capacitive element;
an output transistor having a gate coupled to the capacitive element, and a drain that drives a voltage at the output terminal; and
a current generator configured to generate a charging current that is directed to the capacitive element responsive to a logic transition at the input terminal, wherein the charging current causes a substantially linear ramp voltage to form at the gate of the output transistor, whereby the ramp voltage controls a slew rate of the output terminal voltage;
wherein the current generator is configured to operate off of at least one positive bias voltage above ground that is less than an output power supply rail voltage of the output buffer.

2. The output buffer of claim 1, further comprising:
a switch transistor, coupled to the current generator and the capacitive element, configured to cause the charging current to be directed to the capacitive element responsive to the logic transition.

3. The output buffer of claim 2, wherein the current generator includes:
a constant current source; and
a current mirror coupled to the current source, the capacitive element, and the switch transistor.

4. The output buffer of claim 2, wherein the switch transistor includes:
a gate at least indirectly coupled to the input terminal; and
a source-drain path coupled
(i) between an output node of the current generator and a power supply rail of the output buffer, and
(ii) in parallel with the capacitive element.

5. The output buffer of claim 2, wherein the first circuit portion further includes a logic inverter coupled between the input terminal and a gate of the switch transistor of first circuit portion.

6. The output buffer of claim 2, wherein the second circuit portion includes a logic inverter and an inverter/level-shifter coupled between the input terminal and a gate switch transistor of the second circuit portion.

7. The output buffer of claim 1, further comprising:
a resistor coupled between the drain of the output transistor and the output terminal.

8. The output buffer of claim 1, wherein an output impedance of the output buffer is set substantially in accordance with
(i) a size of the output transistor, and
(ii) the at least one bias voltage.

9. An output buffer comprising:
a first circuit portion and a second circuit portion each coupled between an input terminal and an output terminal of the output buffer, each circuit portion including:
a capacitive element;
an output transistor having a gate coupled to the capacitive element, and a drain that drives a voltage at the output terminal; and
a current generator configured to generate a charging current that is directed to the capacitive element responsive to a logic transition at the input terminal, wherein the charging current causes a substantially linear ramp voltage to form at the gate of the output transistor, whereby the ramp voltage controls a slew rate of the output terminal voltage;
wherein the current generator is configured to operate off of at least one bias voltage that is less than an output power supply rail voltage of the output buffer;
the current generator of the first circuit portion is configured to operate off of a first bias voltage that is less than the power supply rail voltage of the output buffer; and
the current generator of the second circuit portion is configured to operate off of a second bias voltage that is less than the power supply rail voltage and different from the first bias voltage.

10. An output buffer comprising:
a first circuit portion and a second circuit portion, each coupled between an input terminal and an output terminal of the output buffer, each circuit portion including,
a capacitive element;
an output transistor having a gate coupled to the capacitive element, and a drain that drives a voltage at the output terminal;
a current generator configured to generate a charging current that is directed to the capacitive element responsive to a logic transition at the input terminal, wherein the charging current causes a substantially linear ramp voltage to form at the gate of the output transistor, whereby the ramp voltage controls a slew rate of the output terminal voltage; and
a bias voltage generator for producing at least one bias voltage that is less than a power supply rail voltage of the output buffer, wherein the current generators are configured to operate off of the at least one bias voltage.

11. The output buffer of claim 1, wherein
the current generator and output transistor of the first circuit portion are constructed using transistors having respective transistor types, and
the current generator and output transistor of the second circuit portion are constructed using transistors having respective transistor types that are complementary to the transistor types of corresponding transistors in the first circuit portion.

12. The output buffer of claim 1, wherein the output transistor of the first circuit portion is configured to pull-down the output terminal voltage responsive to a low-to-high logic transition at the input terminal.

13. The output buffer of claim 12, wherein the output transistor of the second circuit portion is configured to pull-up the output terminal voltage responsive to a high-to-low logic transition at the output terminal.

14. The output buffer of claim 1, wherein the capacitive element includes a transistor configured as a capacitor.

15. The output buffer of claim 1, wherein the output buffer is a PCI-X I/O output buffer.

16. The output buffer of claim 1, wherein:
the charging current of the first circuit portion charges the respective capacitive element so as to increase the voltage formed thereon; and
the charging current of the second circuit portion charges the respective capacitive element so as to decrease the voltage formed thereon.

17. A circuit portion for use in an output buffer configured to receive an input signal and produce an output signal, comprising:
a capacitive element;
an output transistor having a gate coupled to the capacitive element, and a drain that drives a voltage at the output terminal; and
a current generator configured to generate a charging current that is directed to the capacitive element responsive to a logic transition of the input signal, wherein the charging current causes a substantially linear ramp voltage to form at the gate of the output transistor, whereby the ramp voltage controls a slew rate of the output signal;
wherein the current generator is configured to operate off of at least one positive bias voltage above ground that is less than an output power supply rail voltage of the output buffer.

18. The output buffer of claim 1, further comprising:
a switch transistor, coupled to the current generator and the capacitive element, configured to cause the charging current to be directed to the capacitive element responsive to the logic transition.

* * * * *